United States Patent [19]
Hirschfeld

[11] Patent Number: 5,128,500
[45] Date of Patent: Jul. 7, 1992

[54] SWITCH ASSEMBLY

[75] Inventor: Klaus Hirschfeld, Ludenscheid, Fed. Rep. of Germany

[73] Assignee: Leopold Kostal GmbH & Co. KG, Ludenscheid, Fed. Rep. of Germany

[21] Appl. No.: 454,142

[22] Filed: Dec. 21, 1989

[30] Foreign Application Priority Data

Feb. 17, 1989 [DE] Fed. Rep. of Germany ....... 3904771

[51] Int. Cl.$^5$ ......................... H01H 9/00; H05K 7/10
[52] U.S. Cl. .................... 200/5 R; 361/397; 361/400
[58] Field of Search ............... 200/4, 5 R, 6 R, 6 B, 200/6 BA, 6 BB, 6 C, 17 R, 18, 61.85; 361/393, 394, 395, 400

[56] References Cited

U.S. PATENT DOCUMENTS

| 2,823,272 | 2/1958 | Adams | 200/6 BB |
|---|---|---|---|
| 4,473,724 | 9/1984 | Suzuki | 200/5 R |
| 4,678,872 | 7/1987 | Gutman | 200/5 R |
| 4,695,682 | 9/1987 | Winogrocki | 200/5 R |

FOREIGN PATENT DOCUMENTS 2839367  3/1980  Fed. Rep. of Germany .

Primary Examiner—J. R. Scott
Attorney, Agent, or Firm—Brooks & Kushman

[57] ABSTRACT

A switch assembly for controlling the positioning of motor vehicle seat segments is suggested. THe switch assembly includes switching mechanisms in the form of pre-assembled switch modules which are capable of functioning independently. This creates a switch assembly where the number of different working parts is kept to a minimum. The working parts can be used for movement of the horizontal seat cushion, seat back, and headrest, equally well for both the left and the right vehicle seats. The switch modules are mounted on a printed circuit board which is fitted into a housing. Each printed circuit board is so designed that the switch modules can be inserted from either side. The switch modules each have at least two switch contact systems and are provided with symmetrical connecting means which allow mirror-image arrangement of the switch modules on one or the other side of the printed circuit board.

12 Claims, 4 Drawing Sheets

SWITCH ASSEMBLY

TECHNICAL FIELD

The present invention relates to a switch assembly for controlling positioning motors which adjust the position of such vehicle seat segments such as a horizontal seat cushion, a seat back, and a headrest.

BACKGROUND ART

Switch assemblies for controlling positioning motors which adjust the position of vehicle seat segments are designed so as to allow the user of a motor vehicle to adjust the seat positions electrically. The user of the vehicle may thereby adjust the individual seat segments by moving actuating elements in a direction which corresponds to a desired change in seat position.

Switch assemblies have been described in DE-PS 28 39 367 and U.S. Pat. No. 4,695,682. In these switch assemblies, the working parts of the individual switching devices are built into a housing which is enclosed by a housing cover. The actuating elements are situated on the housing cover and the working parts are designed in such a way that the mechanisms for the different seat segments (horizontal seat cushion, seat back and headrest) are all different from one another and segment-specific. In addition, in these switch assemblies, the working parts are installed in the housing in such a way that different, mirror-image constructions are needed for the right and left vehicle seats. This entails high production costs because of the large number of different working parts and the relatively complex assembly processes involved.

A switch assembly for seat positioning motors for use with motor vehicle seat segments where the switching elements are mounted on a printed circuit board mounted in a housing has been described in U.S. Pat. No. 4,678,872. However, in that disclosure, the switching elements are not designed as pre-assembled switch modules which are capable of functioning as they stand. Instead, they must be constructed from components which are mounted on the printed circuit board and are not capable of self-contained functioning. Such a switch assembly construction, which is in effect an arrangement of pressure switches, makes it necessary to provide a separate user push-button for each direction of adjustment. This is extremely confusing because of the many different directions involved. It can happen that the user must carry out many separate switching operations until the ideal seat position has been established. The extreme user-friendliness of the present invention, where the user only needs to move the actuating elements in a direction corresponding to the direction of movement desired in the seat segment itself to reach the optimum position, cannot be achieved by such individual push-button pressure switch systems.

SUMMARY OF THE PRESENT INVENTION

An object of the present invention is to create a switch assembly with a high level of user-friendliness, where the number of necessary production parts is held to a minimum and where the working parts for adjusting a horizontal seat cushion, seat back and headrest can be interchangeably used for the left as well as the right hand seat, i.e., in mirror-image configurations without alteration.

This object is achieved by providing a switch assembly for controlling positioning motors which adjust the position of vehicle seat segments. Each segment has a switch actuating element which can be displaced in at least two directions. The switch actuating elements are arranged on a housing in a configuration which approximately corresponds to the configuration of the seat segments themselves and can be moved in directions corresponding to the directions in which the seat segments are to be moved. The switch actuating elements are connected with at least one switching mechanism in the housing. All the switching mechanisms are provided in the form of preassembled switch modules which are capable of functioning autonomously and are disposed on a printed circuit board which is mounted within the housing. The switch modules can be inserted into the printed circuit board from either side thereof. Each switch module is equipped with at least two switching contact systems with a symmetrical configuration of pins for insertion into the printed circuit board, thereby allowing the switch modules to be mounted on either side of the printed circuit board as necessary.

One advantage of the present invention lies in the fact that the preassembled switch modules, which are capable of functioning as they stand, give rise to low assembly costs, as all the switch modules necessary for the switch assembly are inserted into the housing together with the printed circuit board. Because of this and particularly also because universal switching modules are used, the assembly and/or production of the complete switch assembly is exceptionally low in cost.

The objects, features, and advantages of the present invention are readily apparent from the following detailed description of the best mode for carrying out the invention when taken in connection with the accompanying drawings.

BEST MODE FOR CARRYING OUT THE INVENTION

Figure 5:
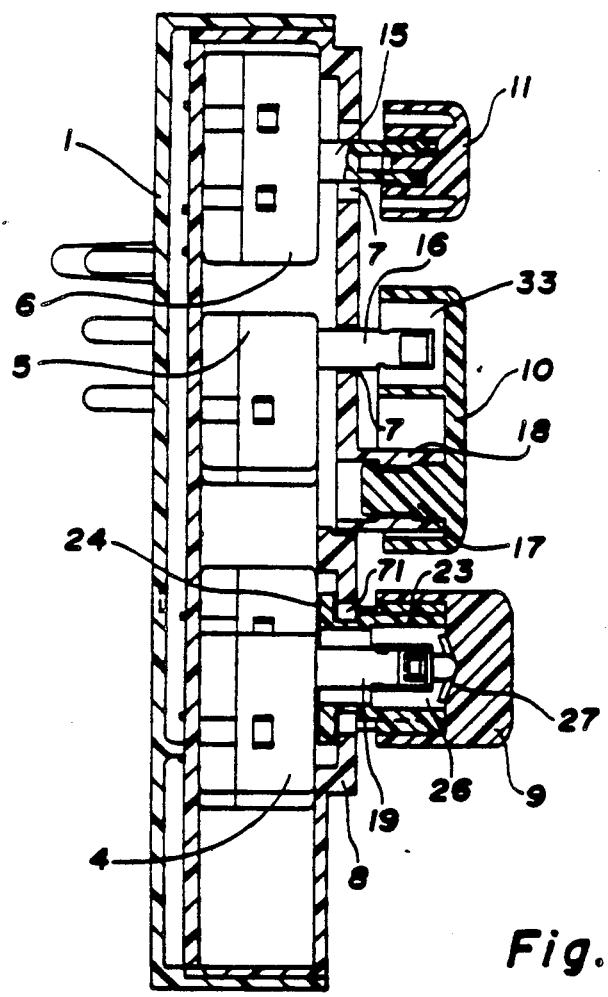
FIG. 5 is a cross-sectional view taken along the section line 5—5 of FIG. 1.

As is clear from the drawings, particularly FIG. 5 identical tilting-lever-type switch modules 2,3,4,5,6 which are fully functional as they stand, are arranged in a housing 1. Switch modules 2,3,4,5,6, designed on a tilting lever principle, are soldered into a printed circuit board 12 which is fixed securely into housing 1. Their tilting lever actuators 15,16,19,20,21 (FIGS. 5 and 6) protrude out of the housing cover through openings 7,71. Three switch modules 2,3,4 are formed into a group for regulating the horizontal seat cushion adjustment, whereby a common switch actuating element 9 serves to actuate all of them. Switch module 5 is responsible for adjusting the position of the seat back and is actuated by actuating element 10. Switch module 6 is responsible for adjusting the headrest position and is actuated by actuating element 11.

The actuating elements 9,10,11 are formed in the shape of the relevant seat segments. The desired adjustment of any seat segment is made much easier because of this shape, which can be recognized by the user (both visually and by touch) as equivalent to the actual seat segments and also because the switches are moved in the same directions as the actual seat segments themselves.

Figure 1:
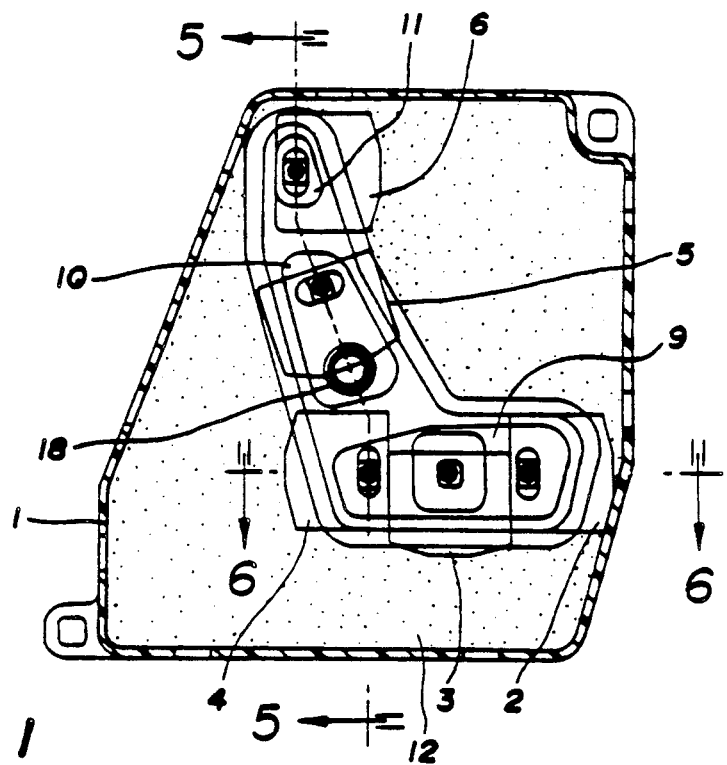
FIG. 1 is a schematic representation of a switch assembly for the left hand driver's seat.

Housing 1, shown in FIG. 1, belongs to the left hand vehicle seat and is positioned in the region of the left hand vehicle door. On the right side of the vehicle, there is a mirror-image housing with switches mounted on it to correspond with the segments of the right hand vehicle seat. Inside these mirror-image housings, electrical and electromechanical parts are used which are as similar as possible so that the number of individual components used in the switch assemblies, seen both individually and together, is kept as low as possible. In addition, switch modules 2,3,4,5,6, which are identical as to their dimensions, are used for both power and control currents.

Figure 2:
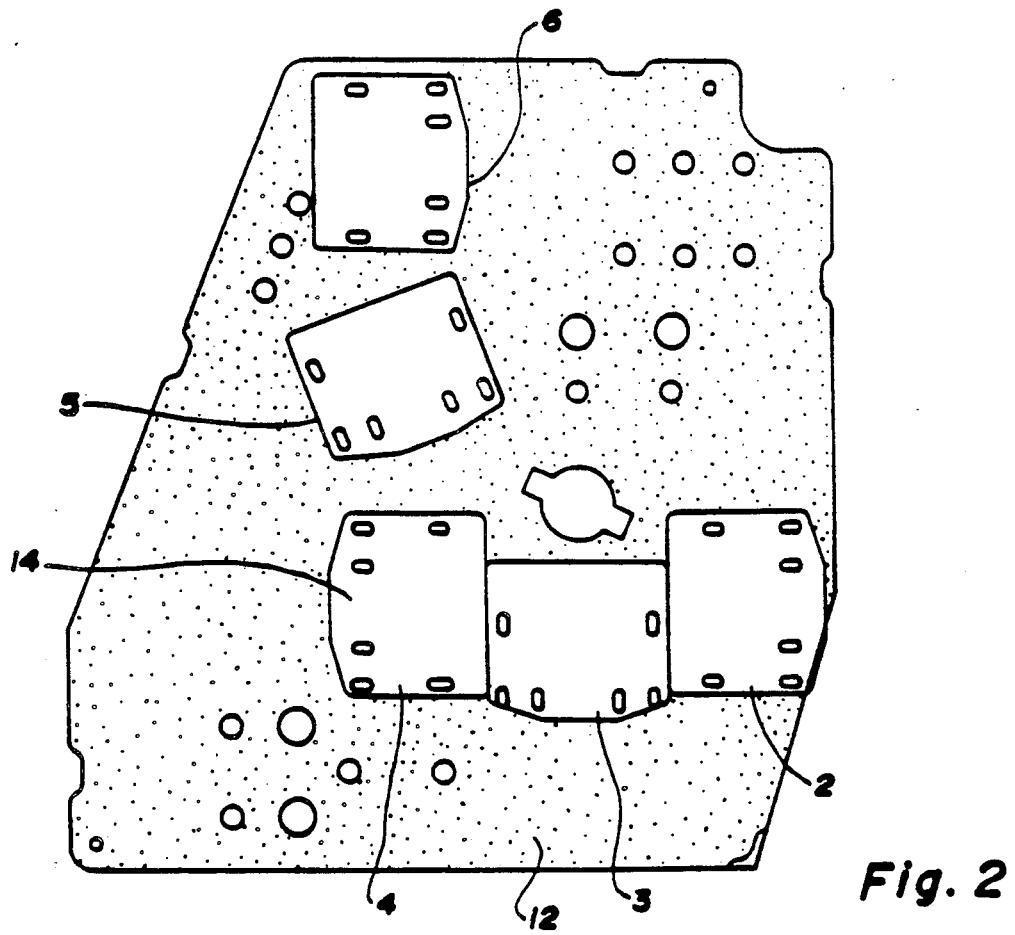
FIG. 2 is an enlarged view of the printed circuit board with insertion slots for switch modules.

FIG. 2 shows a printed circuit board 12 for power current switching, which is positioned in housing 1, in an enlarged form. The insertion slots for switch modules 2,3,4,5,6 are clearly visible in the drawing. Switch modules 2,3,4,5,6 are each provided with 6 connecting means in the form of connector pins, which protrude from the switch module casing and are positioned symmetrically in relation to an imaginary center line 14 as shown. Because of this design, switch modules 2,3,4,5,6, each provided with two snap switching mechanisms in the form of changeover contact systems, can be inserted into the relevant slots in the printed circuit board 12 from either side. FIG. 2 shows a fully assembled printed circuit board 12 with switch modules inserted to correspond to the switch assembly as shown in FIG. 1. For the mirror-image assembly on the right hand side of the vehicle, switch modules 2,3,4,5,6 are inserted into the relevant slots of printed circuit board 12 from the other side, i.e., from the back relative to FIG. 2.

Figure 3:
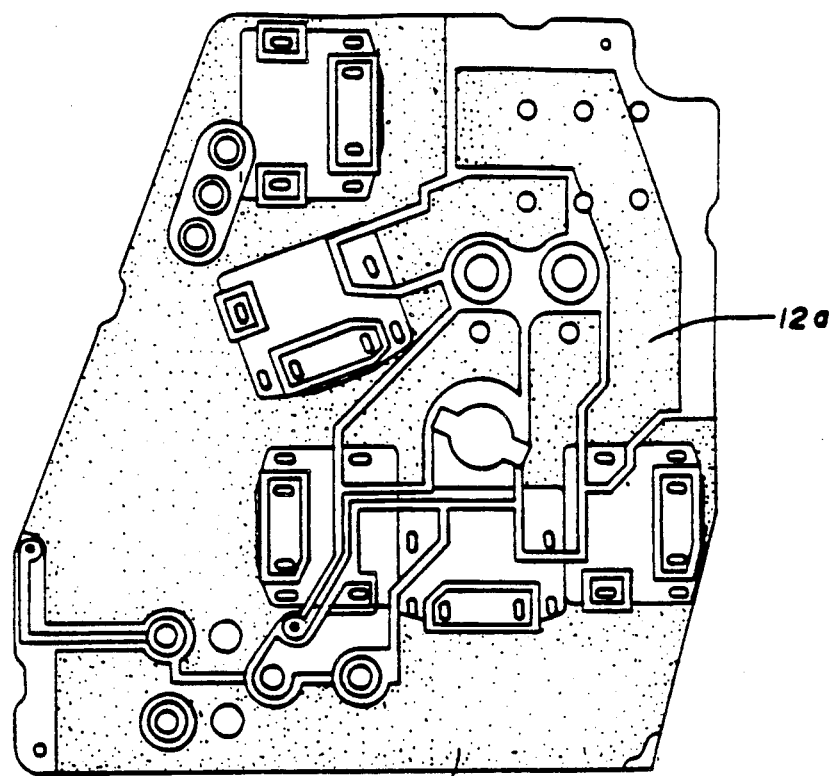
FIG. 3 is a representation of an equivalent printed circuit board with tracks for a power current.

FIG. 3 shows the same printed circuit board 12 complete with tracks 12a for power current switching. Switch modules 2,3,4,5,6 control the flow of current to the different positioning elements—particularly positioning motors—directly. Printed circuit board 12 can also be fitted with additional electrical components as necessary—as for example a light for illuminating the actuating elements.

Figure 4:
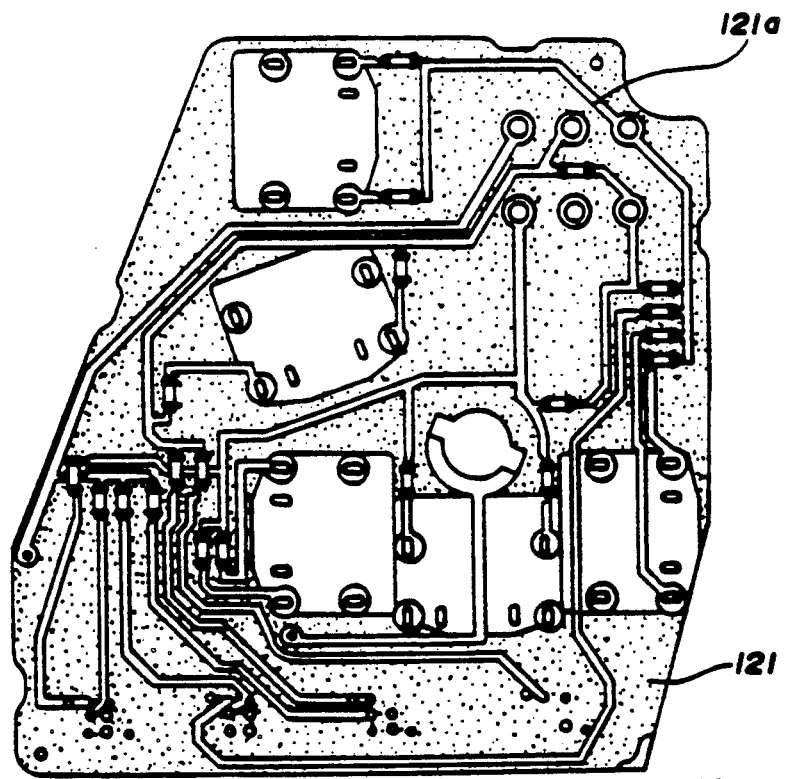
FIG. 4 is a representation of an equivalent printed circuit board with tracks for a control current.

FIG. 4 shows printed circuit board 121. This is identical to printed circuit board 12 as regards external dimensions and the arrangement of the insertion slots for switching modules 2,3,4,5,6. It is therefore possible to mount printed circuit board 121 into the same housing 1 as is used for printed circuit board 12. The tracks 121a of printed circuit board 121 are, however, designed for control current switching, and printed circuit board 121 is fitted accordingly with components which perform the desired switching operations. In order to reduce control wiring complexity, the control current is transmitted in a coded form. Like circuit board 12, this circuit board can be used both for the left hand and right hand sides of the vehicle. This is because, although the electronic components must be mounted on the side of the tracks shown, the switch modules, provided in each case with two snap contact mechanisms in the form of "on"/"off" contact systems can be inserted into the insertion slots of circuit board 121 from either the front or the back. The switch modules are each fitted with preferably four connector pins for this purpose. After the electronic components have been fitted, the switch modules are inserted into printed circuit board 121 from either the front or the back, depending on whether the switch is to be mounted in the right or left hand side of the vehicle. The circuit board is then fitted into the appropriate housing 1. With the use of this invention, only one printed circuit board 12/121 is necessary for the switching of both power and control currents and for fitting into the housings for both left and right hand vehicle seat adjustment.

The actuation of the switching modules will now be described in detail with reference to FIGS. 5-8.

FIG. 5 shows a cross-section of actuating element 11 for headrest adjustment. Tilting lever 15 belonging to switch module 6 protrudes through opening 7 in housing cover 8. Actuating element 11 is pushed onto tilting lever 15. This actuating element can be used to actuate tilting lever 15 so that movement is possible in the plane of FIG. 5, thus enabling the headrest to be adjusted upwards or downwards as appropriate. Actuating element 11 is provided with a molded-on pin which fits tightly into a hole in the top of tilting lever 15, thus enabling the two to be fixed together.

Switch module 5 is used to adjust the seat back. Its tilting lever 16 protrudes through opening 7 of housing cover 8. Tilting lever 16 can be moved perpendicular to the plane of FIG. 5.

Actuating element 10 is shaped like a seat back and is provided with a molded-on pin 17 which fits into a hollow peg 18 in the housing cover 8. Rotatable around this pin, is the actuating element 10 is provided with a guide groove 33 which fits over tilting lever 16. Tilting lever 16 can be slid along groove 33 in the plane of FIG. 5, so that no unwanted tension or tipping movements result when actuating element 10 is rotated. However, upon rotation of actuating element 10, the movement is transferred to the head of tilting lever 16, so that tilting lever 16 is displaced, thereby initiating the corresponding switching operation.

Figure 8:
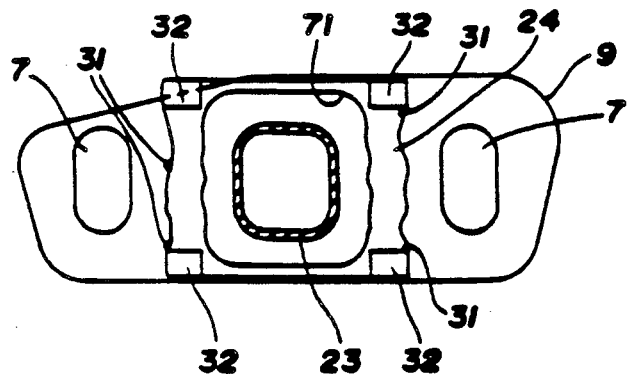
FIG. 8 is a schematic representation of openings in the housing cover.

Three switching modules 2,3,4 provide for adjustment of the horizontal seat cushion position. These will now be described in detail. Tilting lever 19 belonging to switch module 3 can be moved in the plane of FIG. 6, i.e., generally horizontally in relation to FIG. 1. Tilting levers 20 and 21 belonging to switch modules 2 and 4 are, on the other hand, movable in a perpendicular direction relative to the plane of FIG. 6, that is, vertically in relation to FIG. 1. Tilting levers 20 and 21 protrude through openings 7, which are oval in shape (FIG. 8). Tilting lever 19 protrudes through an opening 71 in housing cover 8, whose dimensions are considerably greater than those of openings 7. An open-ended connecting piece 23 also protrudes through opening 71 in the housing cover. This connecting piece 23 has a flange 24 which engages under the edge of opening 71 and is guided in its movements there. Connecting piece 23 encloses tilting lever 19 and serves as a guide piece for actuating element 9. The latter is shaped like a horizontal seat cushion and is fixed tightly over connecting piece 23.

Figure 6:
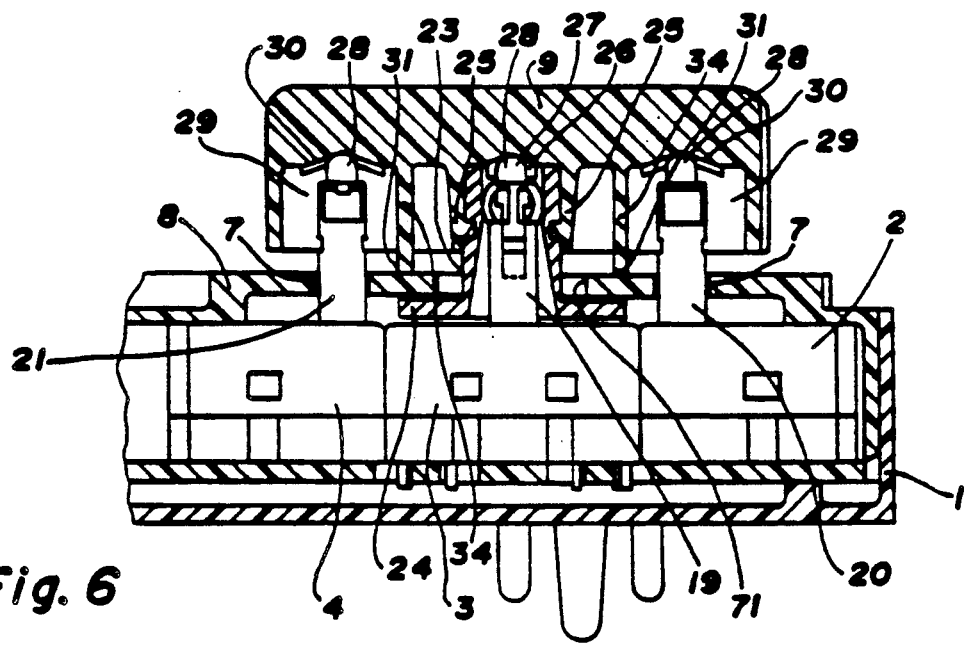
FIG. 6 is a cross-sectional view taken along the section line 6—6 of FIG. 1 of part of the switch for horizontal seat cushion adjustment.
Figure 7:
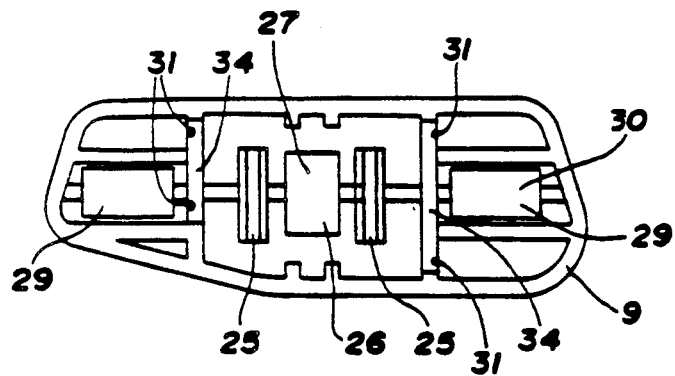
FIG. 7 shows an actuating element for horizontal seat cushion adjustment as seen from below.

As can be seen in FIGS. 6 and 7, this fixing is effected by hooked retaining pieces 25 in actuating element 9 which click onto tongues on connecting piece 23. Approximately in the center of actuating element 9 there is a groove 26 whose axis runs perpendicular to the plane of FIG. 6 and in the plane of FIG. 5. The base 27 of groove 26 has a V-shaped profile. The spring-loaded head 28 of tilting lever 19 ensures that it fits securely into base 27 of groove 26 so that actuating element 9 is always guided without any free play and is always safely returned to its initial position.

It is also possible to manufacture the connecting piece as a closed, hat-like shape. In this case, the guide groove for tilting lever 19 is situated within the "hat dome" and the head of tilting lever 19 has no direct contact with the actuating element itself. Actuating element 9 has further grooves 29, whose axes are in the plane of FIG. 6 and which fit over tilting levers 20,21. The base 30 of this groove also has a V-shaped profile on which the spring-loaded heads 28 of tilting levers 20 and 21 are supported.

Actuating element 9 is guided on the housing cover surface 9 by, on the one hand, raised areas 32 on the upper surface of flange 24 of connecting piece 23, which slide against the inner surface of the housing cover, and on the other hand by sliding feet 31 formed as continuations 34 of the inner vertical dividing walls of actuating element 9, which slide on the outer surface. These raise areas ensure a contact which is more or less limited to certain points, thus preventing excess adhesion.

The shapes of opening 71 as well as openings 7 can be seen in FIG. 8. Flange 24 and opening 71 are of irregular shape. Raised areas 32 are arranged in a relatively symmetrical way. In contrast, sliding feet 31 belonging to actuating element 9 are arranged asymmetrically. This is incorporated into the design in such a way that neither sliding feet 31 nor raised areas 32 slide into openings 7 or 71. Opening 71 also is correspondingly also of an irregular shape.

Connecting piece 23 and actuating element 9 are clipped together as already described and have contact with housing cover 8 on both sides. Because of head 28, connection to the tilting levers is effected with virtually no free play, which prevents rattling noises. By means of the arrangement of switch modules 2,3,4 described above, combined with the shape of actuating element 9 the switching movements are only transferred to the relevant tilting lever 19,20,21 which, however, does not preclude simultaneous actuation of the two tilting levers 20,21 via their actuating elements 10 and 11.

Thus, there has been described a switch assembly for controlling the positioning of motor vehicle seat segments. The switch assembly includes a switching mechanism in the form of preassembled switch modules which are capable of independent functioning, in which the number of different working parts is kept to a minimum. The working parts can be interchangeably used for moving horizontal seat cushions, the seat back, or the head rest, either on the left or right hand side of the vehicle. Switch modules are mounted on a printed circuit board which is designed so that the switch modules can readily be inserted from either side of the board.

What is claimed is:

1. A switch assembly for controlling positioning motors which adjust the location of vehicle seat segments including a horizontal seat cushion, a seat back and a headrest, comprising:

a switch actuating element associated with each vehicle seat segment, the switch actuating element being displaceable in at least two directions;

a housing and a printed circuit board mounted within the housing, the switch actuating elements being mounted on the housing in a configuration approximately corresponding to the configuration of the seat segments themselves, the switch actuating elements being movable in directions corresponding to the directions in which the seat segments are moved; and at least one switching mechanism connected with each actuating element in the housing, wherein all the switching mechanisms are in the form of preassembled switch modules which are capable of functioning autonomously;

said switch modules having a symmetrical configuration of pins and at least two switching contact systems, thereby allowing the switch modules to be mounted on either side of the printed circuit board, so that the switch assembly can be used either on the left or right side of the vehicle.

2. A switch assembly as defined in claim 1, wherein each switch module has a tilting lever and is provided with two switch contact systems which are symmetrically arranged in relation to a plane passing through the associated tilting lever along the tilting lever's central axis.

3. A switch assembly as defined by claim 2, wherein the switching module is symmetrical in relation to a plane passing through the associated tilting lever along the tilting lever's central axis.

4. A switch assembly as defined in claims 2 or 3, wherein all the switch contact systems are of identical design and construction and are disposed in groups, each group having a common actuating element.

5. A switch assembly as defined in claim 1 wherein one of the switch modules is provided with four switching contact systems.

6. A switch assembly as defined in claim 1, wherein each switch module is provided with a control current for energizing the positioning motors and has a tilting lever, all switch modules including "on"/"off" switch contact systems in communication with the control current and two snap switching mechanisms which can be operated by one of the tilting levers.

7. A switch assembly as defined in claim 1, wherein each switch module is provided with a power current has a tilting lever, all switch modules being in the form of changeover contact systems in communication with the power current, and two snap switching mechanisms which can be operated by one of the tilting levers.

8. A switch assembly as defined in claim 1 wherein the switch modules are provided with tilting levers, each tilting lever being provided with spring-loaded tips upon which the switch actuating elements are supported.

9. A switch assembly as in defined claim 1, wherein said housing is provided with a housing cover and each switch module has a tilting lever, wherein three switch modules are associated with the horizontal seat cushion and are provided with two snap switching mechanisms which can be operated by one of the tilting levers, and are aligned so that the direction of displacement of the tilting levers associated with the two outer switching modules is perpendicular to the direction of displacement of the tilting lever associated with the central switch module, a connecting piece enclosing the tilting lever associated with the central switching module which is positioned in an opening in the housing cover, the connecting piece being provided with a flange, the connecting piece being engaged under an edge of the opening by means of the flange, and said switch actuating element being tightly fitted over the connecting piece and also covering the tilting levers of both outer switch modules.

10. A switch assembly as defined in claim 9 wherein the flange of the connecting piece is provided with raised areas which slide against an inner surface of the housing cover and said switch actuating element is provided with sliding feet which slide against an outer surface of the housing cover.

11. A switch assembly as defined in claims 9 or 10 wherein the connecting piece has a closed dome and is provided with a guide channel for the tilting lever associated with the central switching module, one axis of which lying approximately perpendicular to an imaginary line connecting the pins of the outer switch modules, and said actuating element being provided with guide channels for the outer switch modules whose axes lies along the aforementioned imaginary connecting line.

12. A switch assembly as defined in claim 11 characterized by the fact that the bases of guide channels are V-shaped.

* * * * *